United States Patent
Goto et al.

(10) Patent No.: US 9,921,779 B2
(45) Date of Patent: Mar. 20, 2018

(54) MEMORY APPARATUS, MEMORY SYSTEM AND MEMORY CONTROLLING METHOD

(71) Applicant: FUJITSU LIMITED, Kawasaki-shi, Kanagawa (JP)

(72) Inventors: Yoshitsugu Goto, Kawasaki (JP); Osamu Ishibashi, Kawasaki (JP); Sadao Miyazaki, Kawasaki (JP); Jin Abe, Kawasaki (JP); Masaru Itoh, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 3 days.

(21) Appl. No.: 15/137,031

(22) Filed: Apr. 25, 2016

(65) Prior Publication Data

US 2016/0335029 A1 Nov. 17, 2016

(30) Foreign Application Priority Data

May 12, 2015 (JP) ................................ 2015-097684

(51) Int. Cl.
*G01R 31/28* (2006.01)
*G06F 3/06* (2006.01)
(Continued)

(52) U.S. Cl.
CPC .......... *G06F 3/0659* (2013.01); *G06F 3/0605* (2013.01); *G06F 3/0613* (2013.01); *G06F 3/0619* (2013.01); *G06F 3/0673* (2013.01); *G06F 11/1008* (2013.01); *G06F 12/0292* (2013.01); *G06F 2212/1016* (2013.01);
(Continued)

(58) Field of Classification Search
CPC .. G06F 3/0659; G06F 11/1008; G06F 3/0613; G06F 3/0673; G06F 12/0292; G06F 3/0619; G06F 3/0605; G06F 2212/1016; G06F 2212/202; G06F 2212/281; G06F 2212/608; G11C 29/52
See application file for complete search history.

(56) References Cited

U.S. PATENT DOCUMENTS

| | | | | |
|---|---|---|---|---|
| 5,982,955 A | * | 11/1999 | Yaguchi | G06K 9/2054 382/305 |
| 2013/0067148 A1 | * | 3/2013 | Takagi | G06F 3/0611 711/103 |

(Continued)

FOREIGN PATENT DOCUMENTS

JP 2014-16744 1/2014

*Primary Examiner* — Thien Nguyen
(74) *Attorney, Agent, or Firm* — Fujitsu Patent Center (57) ABSTRACT

A memory apparatus, includes: a memory including memory regions; a table storing a memory address and a number of reading times of data; a first buffer storing first data from another memory apparatus and a first memory address of the first data; a second buffer storing second data to the another memory apparatus and a second memory address of the second data; and a controller configured to store, when a first number of reading times being minimum in the table is smaller than a second number of reading times of the first data, the first data and the first memory address into the first buffer and outputs third data in a memory region of the first number and a third memory address of the third data to the another memory apparatus via the second buffer, and rewrites the third data and memory address with the first data and memory address.

14 Claims, 8 Drawing Sheets

(51) Int. Cl.
*G06F 12/02* (2006.01)
*G06F 11/10* (2006.01)
*G11C 29/52* (2006.01)

(52) U.S. Cl.
CPC .. *G06F 2212/202* (2013.01); *G06F 2212/281* (2013.01); *G06F 2212/608* (2013.01); *G11C 29/52* (2013.01)

(56) References Cited

U.S. PATENT DOCUMENTS

| | | | | |
|---|---|---|---|---|
| 2014/0143474 A1* | 5/2014 | Damle | ................ | G06F 12/0246 711/103 |
| 2015/0309926 A1* | 10/2015 | Damle | ................ | G06F 12/0246 711/103 |

* cited by examiner

MEMORY APPARATUS, MEMORY SYSTEM AND MEMORY CONTROLLING METHOD

CROSS-REFERENCE TO RELATED APPLICATION

This application is based upon and claims the benefit of priority of the prior Japanese Patent Application No. 2015-097684, filed on May 12, 2015, the entire contents of which are incorporated herein by reference.

FIELD

The embodiment relates to a memory apparatus, a memory system and a memory controlling method.

BACKGROUND

In a system in which a plurality of memory devices each including a dynamic random access memory (DRAM) element or the like are coupled to a host such as a central processing unit (CPU), the plurality of memory devices are coupled one by one in parallel to the host (parallel coupling) or are coupled in cascade coupling to the host (cascade coupling).

A related art is disclosed in Japanese Laid-open Patent Publication No. 2014-16744.

SUMMARY

According to an aspect of the embodiment, a memory apparatus, includes: a memory including a plurality of memory regions storing data; a table configured to store a memory address and a number of reading times of data stored in the memory for each of the memory regions; a first buffer configured to store first data input from another memory apparatus and a first memory address of the first data; a second buffer configured to store second data to be output to the another memory apparatus and a second memory address of the second data; and a controller configured to control the memory, wherein the controller: stores, when a first number of reading times that is minimum in the table is smaller than a second number of reading times of the first data, the first data and the first memory address into the first buffer and outputs third data in a memory region corresponding to the first number of reading times and a third memory address of the third data as the second data and the second memory address, respectively, to the another memory apparatus via the second buffer, and rewrites, at a given timing, the third data and the third memory address in the memory region corresponding to the first number of reading times with the first data and the first memory address stored in the first buffer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

If data is not found in a cache memory in a host (mishit), the host reads out data from a memory device (main memory) coupled thereto and writes the data into the cache memory. Therefore, the throughput of the memory access is improved.

For example, in a system that includes memories having different access speeds, matching between physical addresses and logical addresses is controlled such that data whose reading frequency is high on the host side is allocated to a memory having a high access speed.

In a system in which a plurality of memory devices are coupled to a host, for example, the plurality of memory devices are coupled one by one in parallel to the host. Although the latency in memory access is equal among all of the memory devices, since the number of signals to be coupled to the host (the number of coupling pins of the host) increases in response to the number of memory devices, the area or the like of the host increases and the cost increases. For example, if the plurality of memory devices are coupled in cascade coupling to each other, the number of signals to be coupled to the host decreases and the area or the like of the host decrease. However, when data stored in a memory device disposed far away from the host is to be read out, the memory device is accessed through the memories interposed between the host and the memory device, and therefore, the latency increases.

Figure 1:
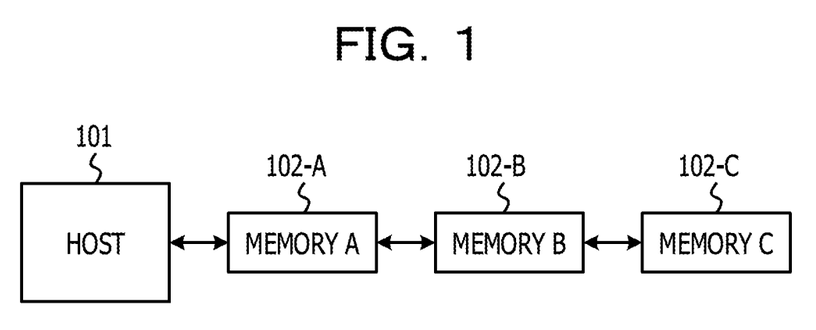
FIG. 1 depicts an example of a system configuration.

FIG. 1 depicts an example of a system configuration. The system depicted in FIG. 1 includes a host 101 such as a CPU, and a plurality of memory devices (memory units) 102-A, 102-B and 102-C coupled in cascade coupling to the host 101.

Each of the memory devices 102-A, 102-B and 102-C includes a storage element such as, for example, a DRAM element. Although, in FIG. 1, the three memory devices 102-A, 102-B and 102-C are coupled in cascade coupling, the number of memory devices to be coupled in cascade coupling is an arbitrary plural number.

In the system depicted in FIG. 1, when data stored in the memory device 102-B is to be read out by the host 101, memory access to the memory device 102-B is performed via the memory device 102-A. Similarly, when data stored in the memory device 102-C is to be read out by the host 101, memory access to the memory device 102-C is performed via the memory device 102-A and the memory device 102-B. Accordingly, the latency in memory access from the host 101 increases in order of the memory device 102-A, the memory device 102-B and the memory device 102-C.

Figure 2:
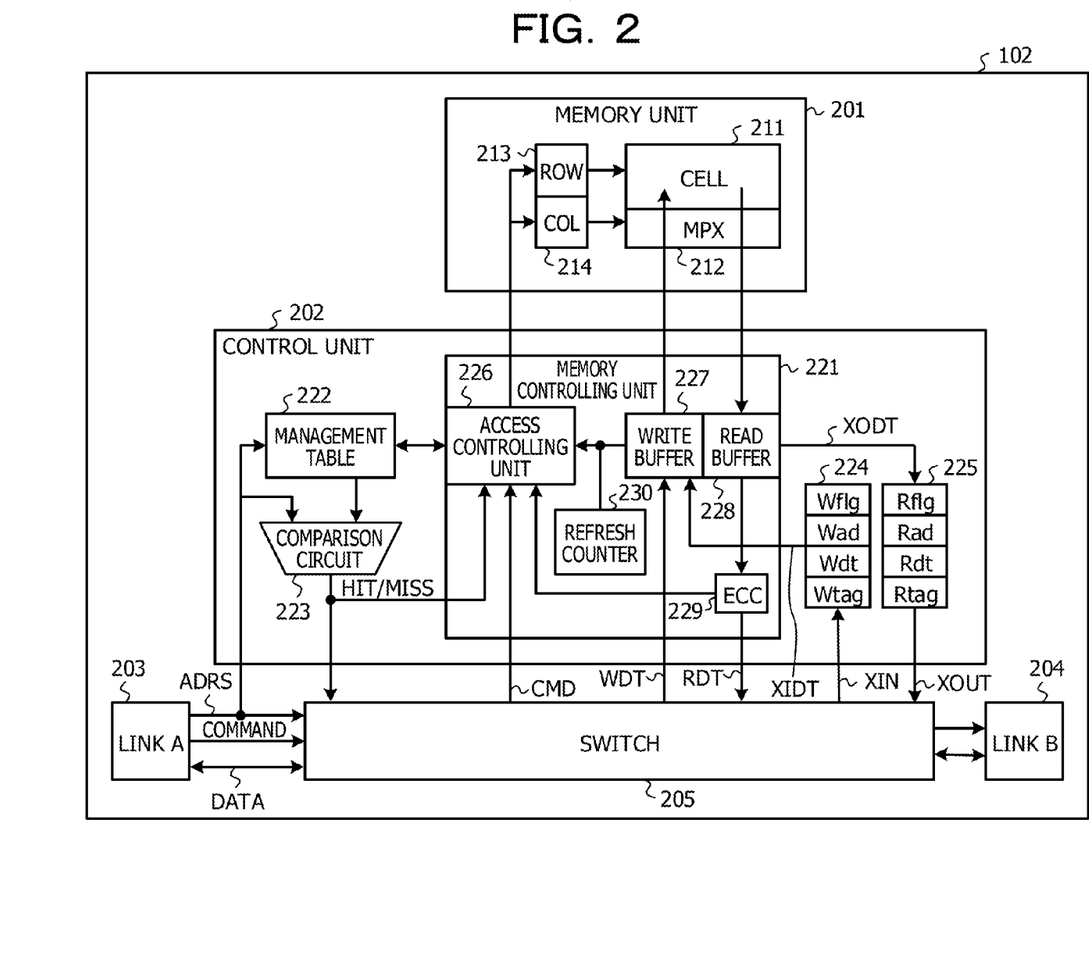
FIG. 2 depicts an example of a configuration of a memory device.

FIG. 2 depicts an example of a configuration of each memory device. The memory device 102 includes a memory unit 201, a control unit 202, link units 203 and 204, and a switch unit 205.

The link units 203 and 204 transmit and receive a command, an address and data by serial or parallel transmission to and from the outside. The link unit 203 transmits and receives a command, an address and data to and from a previous one memory device coupled to the preceding stage (or the host 101 if a memory device coupled to the first stage). The link unit 204 transmits and receives a command, an address and data to and from a next memory device coupled to the succeeding stage. The switch unit 205 controls transfer of a command, an address and data between the memories. The switch unit 205 performs sequential control, for example, when competition occurs.

The memory unit 201 includes a memory cell unit 211 including a plurality of memory cells for storing data and a multiplexer 212 for inputting and outputting data to and from a selected memory cell. The memory unit 201 includes a row decoder 213 and a column decoder 214 for selecting a memory cell in accordance with a row address and a column address supplied thereto from the control unit 202.

The control unit 202 controls the memory unit 201. The control unit 202 includes a memory controlling unit 221, a management table 222, a comparison circuit 223, a writing buffer 224 and a reading out buffer 225. The memory controlling unit 221 includes an access controlling unit 226, a write buffer 227, a read buffer 228, an error correcting code (ECC) management unit 229 and a refresh counter 230 and controls memory access to the memory unit 201.

The access controlling unit 226 performs generation of a row address and a column address to be supplied to the memory unit 201 and timing control based on a command CMD input thereto from the switch unit 205, an output of the comparison circuit 223, an output of the refresh counter 230 and so forth. The write buffer 227 outputs data WDT (XIDT) to be written into a memory to the memory unit 201. The read buffer 228 outputs data RDT (XODT) read out from the memory unit 201.

The ECC management unit 229 decides whether or not the data RDT read out from the memory unit 201 includes an error based on error correcting codes and performs an error correcting process if a detected error is a correctable error. The ECC management unit 229 issues a request for a redundancy process to the access controlling unit 226 as occasion demands. The refresh counter 230 counts the elapsed time (elapsed cycles) and issues a request for execution of refreshing.

Figure 3:
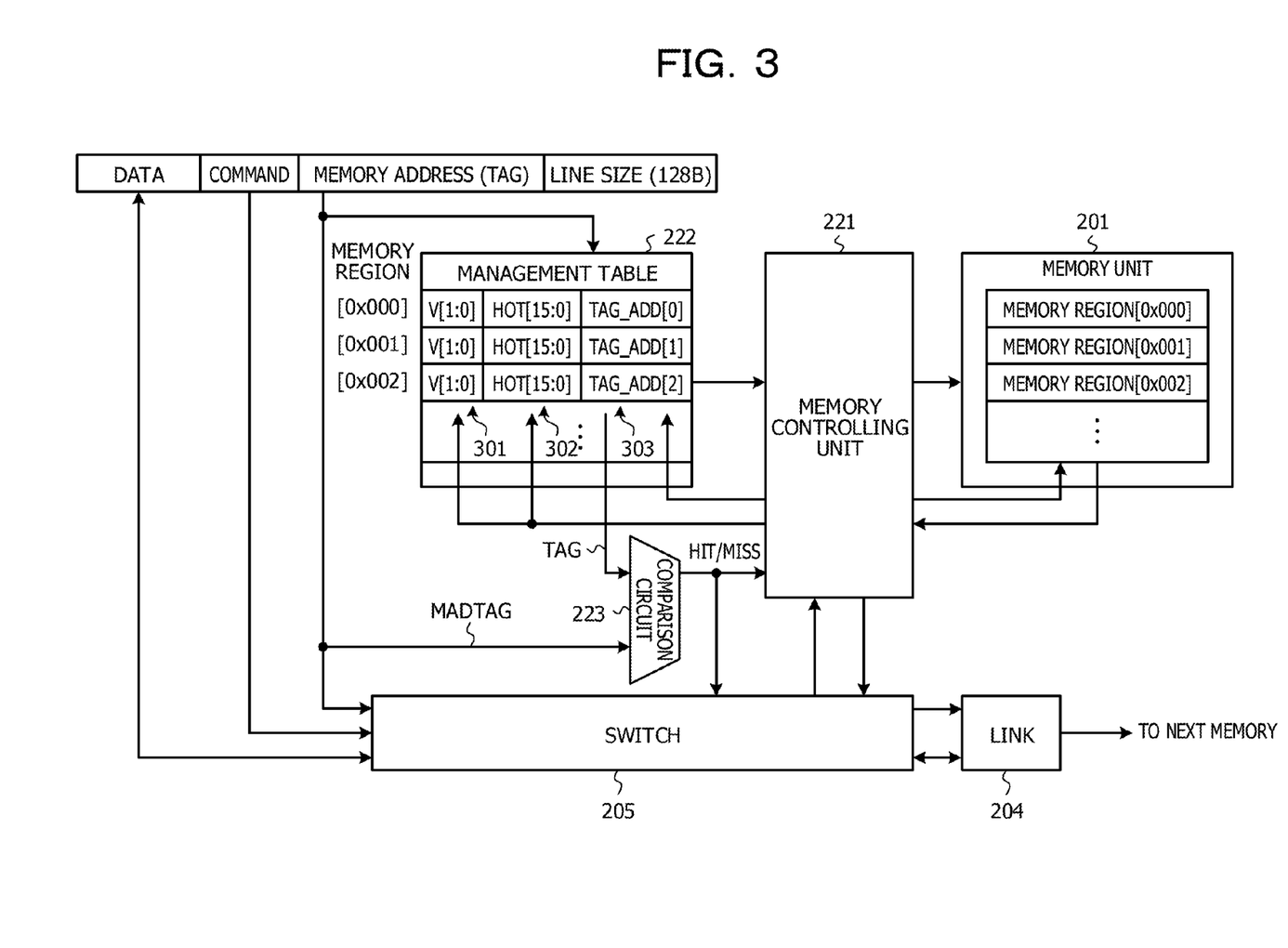
FIG. 3 depicts an example of a management table.

The management table 222 is a table for retaining and managing a memory address and a reading out time number of data stored in the memory unit 201. The management table 222 includes a register for each memory region of a line size unit of the memory unit 201. FIG. 3 depicts an example of a management table. As depicted in FIG. 3, each of the registers of the management table 222 depicted in FIG. 2 includes three fields 301, 302 and 303. Referring to FIG. 3, components including substantially same or like functions to those of the components depicted in FIG. 2 are denoted by like reference symbols, and overlapping description of them may be omitted or reduced herein.

In the first field 301, information V[1:0] indicative of a state of a memory region in regard to whether data stored in the corresponding memory region is valid or invalid or the like is stored. In the second field 302, a count value HOT[15:0] indicative of a number of reading times of the data stored in the corresponding memory region is stored. In the third field 303, a memory address of the data stored in the corresponding memory region is stored. In the third field 303, a tag part TAG_ADD of a memory address except lower bits corresponding to the line size is stored.

The comparison circuit 223 performs comparison between a tag part MADTAG of the address output from the host 101 and the tag part TAG_ADD stored in the management table 222 with each other. The comparison circuit 223 outputs a comparison result of the tag part of the address (signal representative of whether or not the comparison result indicates coincidence).

The writing buffer 224 and the reading out buffer 225 are buffers for retaining information to be used for exchange of data between the memory devices 102. The writing buffer 224 is a buffer for retaining information XIN relating to exchange data to be written into the own memory unit 201, and retains a write flag Wflg, an address Wad, data Wdt and a tag Wtag. The reading out buffer 225 is a buffer for retaining information XOUT relating to purge data to be written into the memory unit 201 of the next memory device in the cascade coupling, and retains a readout flag Rflg, an address Rad, data Rdt and a tag Rtag.

In the following description, the memory device 102-A may be referred to as memory A; the memory device 102-B as memory B; and the memory device 102-C as memory C.

Figure 4:
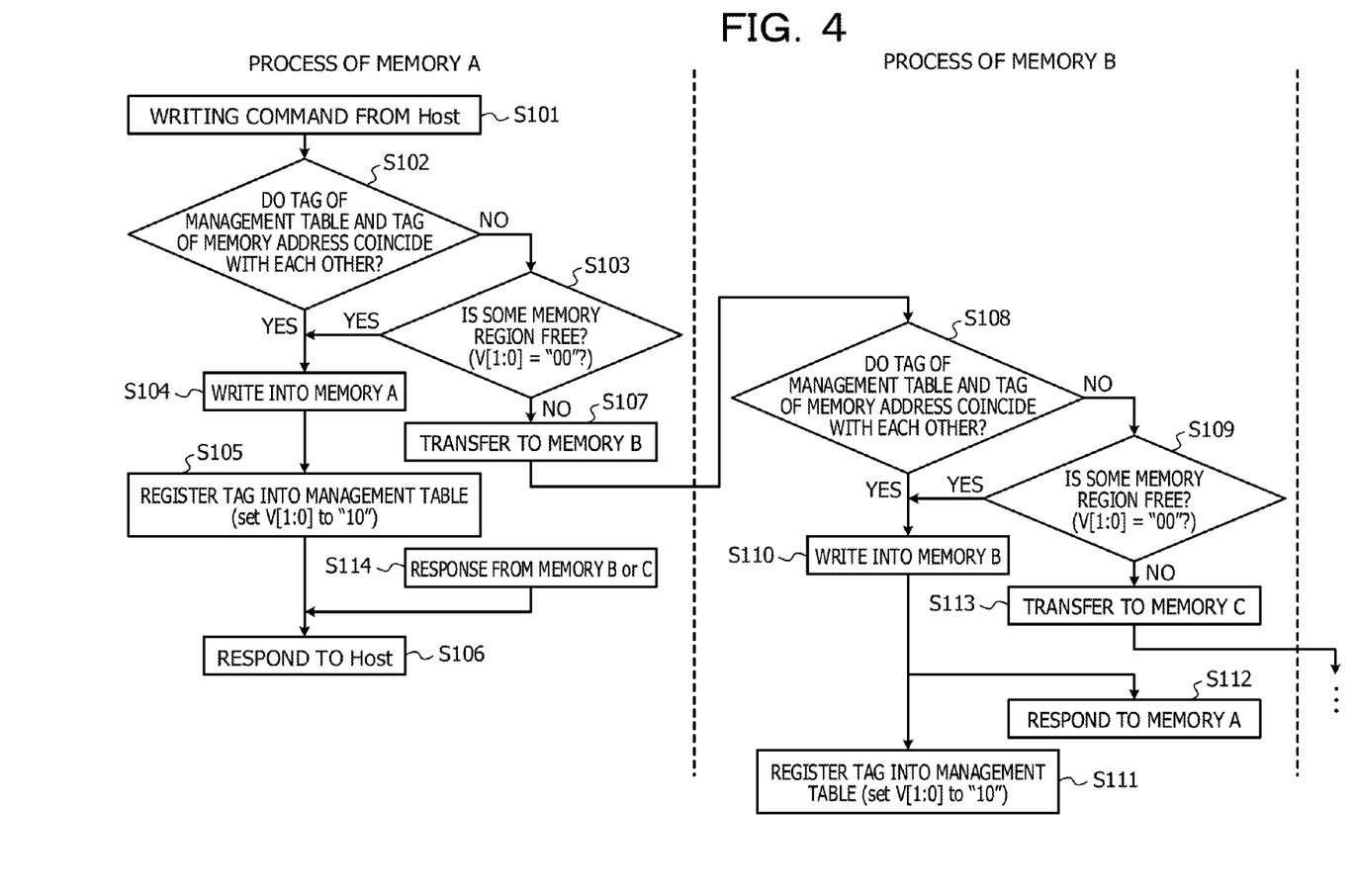
FIG. 4 depicts an example of writing operation.

FIG. 4 depicts an example of writing operation. In FIG. 4, an example of writing operation from the host 101 is illustrated. If the memory A receives a writing instruction from the host 101 (S101), the control unit 202 of the memory A decides whether or not the tag parts TAG_ADD stored in the registers that indicate validity (information V[1:0]="10") in the management table 222 and the tag part MADTAG of the memory address from the host 101 coincide with each other (S102).

If a tag part TAG_ADD coincident with the tag part MADTAG of the memory address from the host 101 is not found in the management table 222 (NO at S102), the control unit 202 of the memory A decides whether or not the memory unit 201 has a free memory region (S103). The control unit 202 of the memory A decides a memory region in which the information V[1:0] has the value "00" in the management table 222 as a free state, and decides, if a register in which the information V[1:0] is the value "00" is found, that the memory region is a free region.

If the tag parts TAG_ADD stored in the management table 222 and the tag part MADTAG of the memory address from the host 101 coincide with each other (YES at S102), or if a memory region is a free region (YES at S103), the processing advances to operation at S104. The control unit 202 of the memory A performs writing into the memory region (S104) and updates the management table 222 (S105). In the updating of the management table 222 by the operation at S105, the tag part of the memory address is registered as the tag part TAG_ADD into the register corresponding to the memory region for which the writing has been performed, and the value "10" is set in the information V[1:0]. Thereafter, the memory A issues a response to the host 101 that writing has been performed (S106).

If a result of the decision by the operation at S103 indicates that the memory regions include no free region (NO at S103), the memory A transfers the writing command to the next memory B (S107). The control unit 202 of the memory B receives the writing command and decides whether or not the tag parts TAG_ADD stored in valid registers in the management table 222 and the tag part MADTAG of the memory address coincide with each other (S108). If a tag part TAG_ADD coincident with the tag part MADTAG of the memory address is not found in the management table 222 (NO at S108), the control unit 202 of the memory B decides whether or not the memory unit 201 has a free memory region (S109).

If a tag part TAG_ADD stored in the management table 222 and the tag part MADTAG of the memory address coincide with each other (YES at S108), or if the memory regions include a free region (YES at S109), the processing advances to operation at S110. The control unit 202 of the memory B performs writing into the memory region (S110) and updates the management table 222 (S111). In the updating of the management table 222 in the operation at S111, the tag part of the memory address is registered as the tag part TAG_ADD into the register corresponding to the memory region into which the writing has been performed and the information V[1:0] is set to the value "10." The memory B sends a response to the memory A that writing has been performed (S112), and the memory A receives this and issues a response to the host 101 (S106).

If a result of the decision by the operation at S109 indicates that the memory regions have no space (No at S109), then the memory B transfers the writing command to the next memory C (S113). The memory C receives the writing command and may perform processing similar to that of the memory B.

Figure 5:
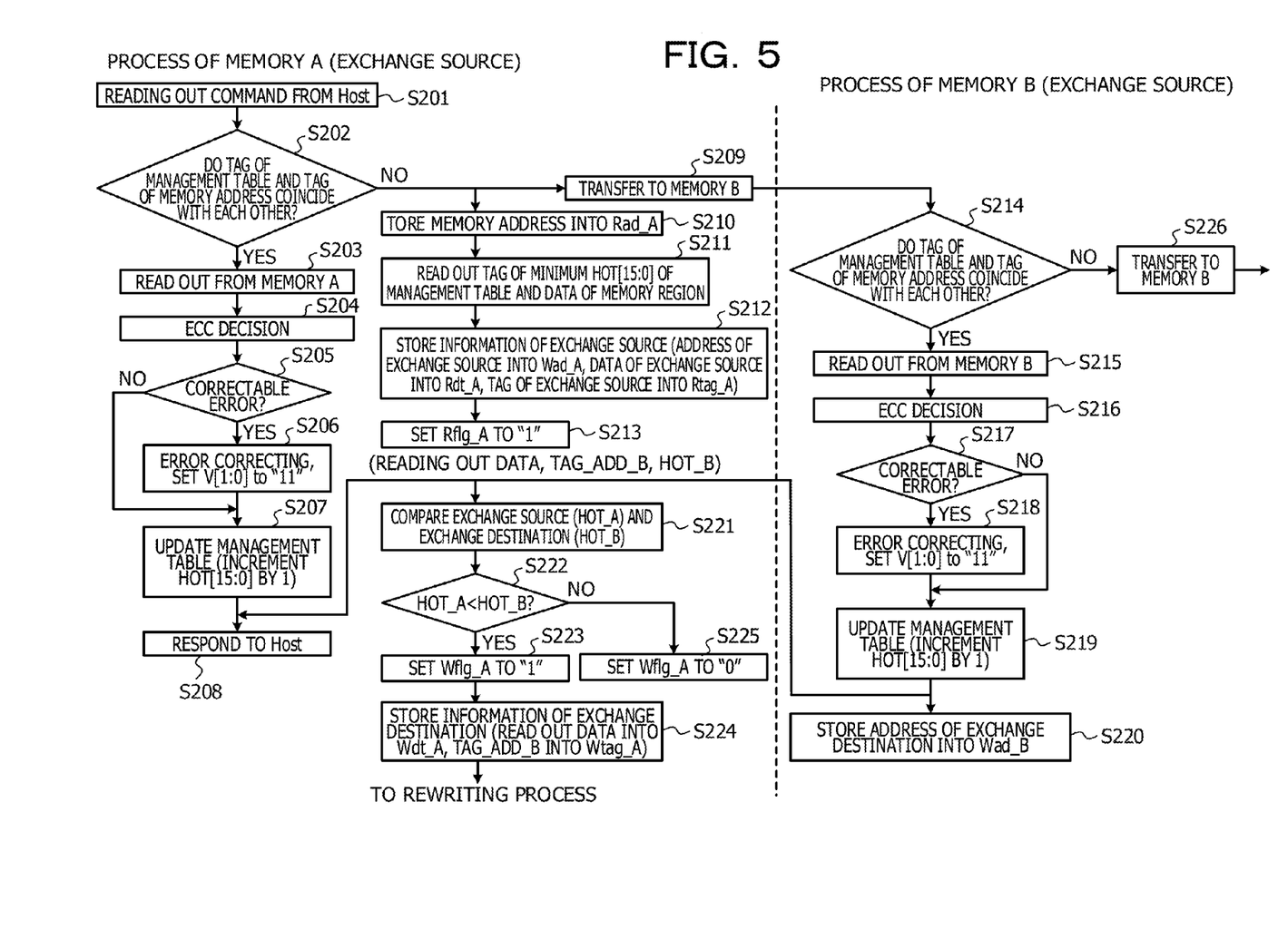
FIG. 5 depicts an example of reading out operation.

FIG. 5 depicts an example of reading out operation. In FIG. 5, an example of reading out operation from the host 101 is depicted. If the memory A receives a reading out command from the host 101 (S201), the control unit 202 of the memory A decides whether or not the tag parts TAG_ADD stored in valid registers in the management table 222 and the tag part MADTAG of the memory address from the host 101 coincide with each other (S202).

If a tag part TAG_ADD stored in the management table 222 and the tag part MADTAG of the memory address from the host 101 coincide with each other (YES at S202), the control unit 202 of the memory A reads out data from the memory region (S203). The control unit 202 of the memory A decides whether or not the read out data includes an error based on error correcting codes of the data (S204). If a correctable data error is detected (YES at S205), the control unit 202 of the memory A corrects the error and sets the information V[1:0] to the value "11" indicative of a failure (S206).

The control unit 202 of the memory A increments the count value HOT[15:0] for the number of reading times stored in the register corresponding to the memory region from which the data has been read out by 1 and updates the management table 222 (S207). Thereafter, the memory A issues a response to the reading out command to the host 101 (S208).

If a result of the decision by the operation at S202 indicates that the management table 222 does not include a tag part TAG_ADD which coincides with the tag part MADTAG of the memory address from the host 101 (No at S202), the memory A transfers the reading out command to the next memory B (S209). The control unit 202 of the memory A stores the memory address into an address Rad_A ("_A" indicates a relation with A: this similarly applies also to the following description) of the reading out buffer 225 (S210). The control unit 202 of the memory A reads out a tag part TAG_ADD that is valid in the management table 222 and corresponds to a minimum count value HOT[15:0], and reads out data from the corresponding memory region (S212).

The control unit 202 of the memory A stores information of the exchange source into the buffers 224 and 225 (S212). In the storage of the information of the exchange source by the operation at S212, the data and the tag part TAG_ADD read out by the operation at S211 are stored into the data Rdt_A and the tag Rtag_A of the reading out buffer 225, and the address value indicative of the corresponding memory region is stored into the address Wad_A of the writing buffer 224. The control unit 202 of the memory A sets the readout flag Rflg_A of the reading out buffer 225 to "1" (S213).

The control unit 202 of the memory B receives the reading out command and decides whether or not the tag parts TAG_ADD stored in valid registers in the management table 222 and the tag part MADTAG of the memory address coincide with each other (S214). If a tag part TAG_ADD stored in the management table 222 and the tag part MAD-TAG of the memory address coincide with each other (YES at S214), the control unit 202 of the memory B reads out data from the memory region (S215). The control unit 202 of the memory B decides whether or not the read out data includes an error based on error correcting codes (S216). If a data error that can be corrected is found (YES at S217), the control unit 202 of the memory B corrects the error and sets the information V[1:0] to the value "11" (S218).

Then, the control unit 202 of the memory B increments the count value HOT[15:0] of the number of reading times stored in a register corresponding to the memory region from which the data has been read out by 1 and updates the management table 222 (S219). The control unit 202 of the memory B issues a response of the read out data, the count value HOT_B of the management table 222 ("_B" indicates a relation with the memory B: this similarly applies also to the following description) and the tag part TAG_ADD_B to the memory A that is a memory device coupled immediately preceding to the memory B, and stores an address value indicative of the corresponding memory region into the address Wad_B of the writing buffer 224 (S220). If a result of the decision of the operation at S214 indicates that a tag part TAG_ADD coincident with the tag part MADTAG of the memory address is not found in the management table 222 (NO at S214), the memory B transfers the reading out command to the memory C (S226). The memory C receives the reading out command and performs processing similar to that of the memory B.

The memory A receiving the response from the memory B issues a response to the reading out command to the host 101 (S208). The control unit 202 of the memory A compares the count value HOT_A corresponding to the memory region indicated by the address value of the address Wad_A of the writing buffer 224 and the count value HOT_B received from the memory B with each other (S221). For example, the control unit 202 of the memory A compares the lowest count value HOT_A in the management table 222 of the memory A and the count value HOT_B received from the memory B with each other.

If the count value HOT_A is lower than the count value HOT_B (YES at S222), the control unit 202 of the memory A sets a write flag Wflg_A of the writing buffer 224 to "1" (S223) and stores the information of the exchange destination into the writing buffer 224 (S224). In the storage of the information of the exchange destination by the operation at S224, the read out data from the memory B and the tag part TAG_ADD_B are stored into a data Wdt_A and a tag Wtag_A of the writing buffer 224, respectively. The processing advances to a rewriting operation. Since the data read out from the memory B is data for which error correcting has been performed if the data has included a correctable error, a rewriting operation is performed with the data after the error correcting.

If a result of the comparison by the operation at S221 indicates that the count value HOT_A is equal to or higher than the count value HOT_B (NO at S222), the control unit 202 of the memory A sets the write flag Wflg_A of the writing buffer 224 to "0" (S225).

Figure 6:
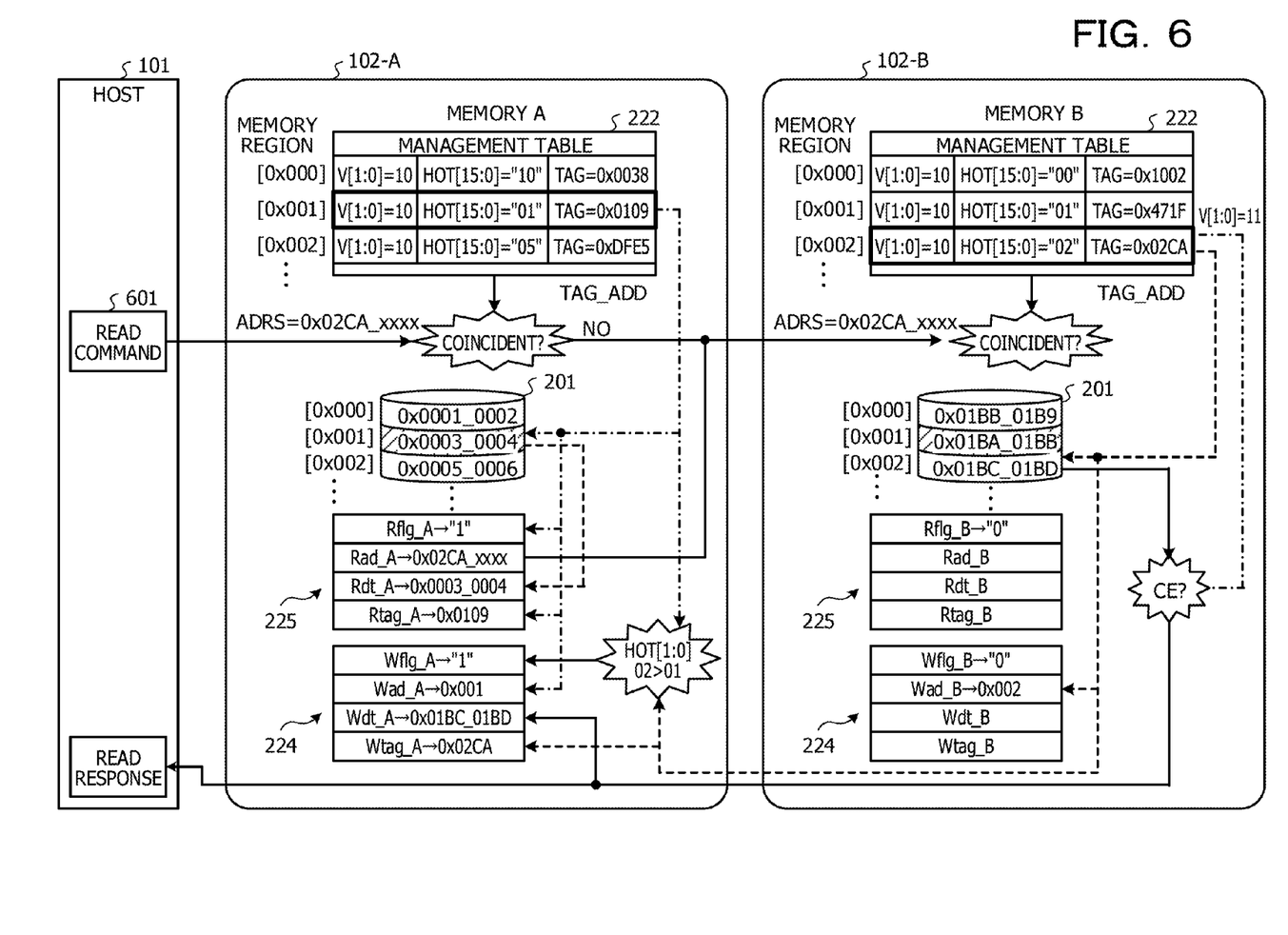
FIG. 6 depicts an example of reading out operation.

FIG. 6 depicts an example of reading out operation. For example, as depicted in FIG. 6, a reading out command (read command) 601 for a memory address 0x02CA_xxxx is issued from the host 101. At this time, since the management table 222 of the memory A does not have information coincident with the tag part 0x02CA of the memory address, the memory address is stored into the address Rad_A of the reading out buffer 225 and the reading out command is transferred to the memory B. In the memory A, a tag part with regard to the count value HOT is in the minimum in the management table 222 and data in a corresponding memory region are stored into the tag Rtag_A and the data Rdt_A of the reading out buffer 225, respectively, and an address value indicative of the corresponding memory region is stored into the address Wad_A of the writing buffer 224. The readout flag Rflg_A of the reading out buffer 225 is set to "1."

Since information coincident with the tag part 0x02CA of the memory address is found in the management table 222 of the memory B receiving the reading out command for the memory address 0x02CA_xxxx, in the memory B, data is read out from the corresponding memory region. Since the count value HOT corresponding to the memory region from which the data has been read out is higher than the minimum count value HOT in the memory A, the write flag Wflg_A of the writing buffer 224 of the memory A is set to "1". The read out data from the memory B and the tag part corresponding to the memory region from which the data has been read out are stored into the data Wdt_A and the tag Wtag_A of the writing buffer 224 of the memory A, respectively. The address value indicative of the memory region from which the data has been read out is stored into the address Wad_B of the writing buffer 224 of the memory B.

Figure 7:
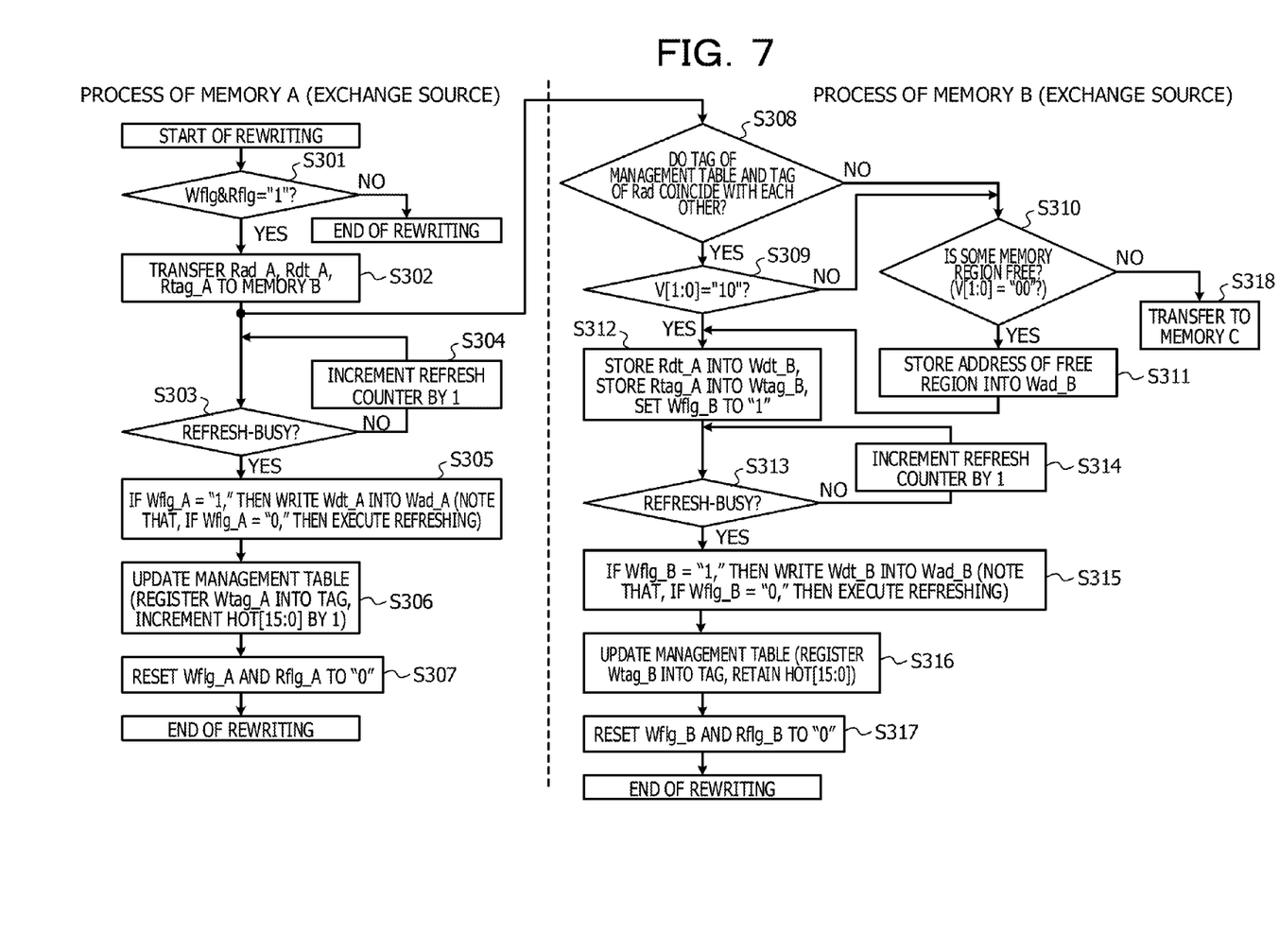
FIG. 7 depicts an example of rewriting operation.

FIG. 7 depicts an example of rewriting operation. In FIG. 7, an example of the rewriting operation between the memory devices 102 is depicted. In the following, rewriting (exchange) of data which is performed between the memory A and the memory B is described. However, rewriting (exchange) of data between other memory devices adjacent each other may be performed similarly. The rewriting operation between memory devices 102 may preferably be performed only by processing between the memory devices 102 without the intervention of the host 101 in the processing.

The control unit 202 of the memory A confirms whether or not both of the write flag Wflg_A of the writing buffer 224 and the readout flag Rflg_A of the reading out buffer 225 are equal to "1" (S301). If at least one of the write flag Wflg_A and the readout flag Rflg_A is "0" (NO at S301), the rewriting operation is ended. The control unit 202 of the memory A may starts the rewriting process, for example, when both of the write flag Wflg_A and the readout flag Rflg_A become "1" (YES at S301), and then the processing advances to operation at S302.

After the writing process is started, the control unit 202 of the memory A transfers values stored in the address Rad_A, the data Rdt_A and the tag Rtag_A of the reading out buffer 225 to the memory B (S302) and rewrites the data in the corresponding memory region with the read out data from the memory B. For this rewriting timing, a refresh cycle of the DRAM may be utilized. If the present point of time is not an execution timing for refreshing (refresh-busy) (NO at S303), the control unit 202 of the memory A increments the count value of the refresh counter 230 by 1 (S304). If the count value of the refresh counter 230 reaches a given value and an execution timing for refreshing comes (YES at S303), the control unit 202 of the memory A confirms a state of the write flag Wflg_A of the writing buffer 224.

If the write flag Wflg_A is "1", the control unit 202 of the memory A writes the data stored in the data Wdt_A into the memory region indicated by the address value stored in the address Wad_A of the writing buffer 224 (S305). If the write flag Wflg_A is "0", the control unit 202 of the memory A performs refreshing operation.

After the rewrite data is written into the memory region, the control unit 202 of the memory A registers the value stored in the tag Wtag_A of the writing buffer 224 into the tag part of the register corresponding to the memory region into which the writing has been performed and increments the count value HOT[15:0] by 1 and updates the management table 222 (S306). After the operation described above comes to an end, the control unit 202 of the memory A resets both of the write flag Wflg_A of the writing buffer 224 and the readout flag Rflg_A of the reading out buffer 225 to "0", thereby ending the rewriting operation.

The control unit 202 of the memory B receives the address Rad_A, the data Rdt_A and the tag Rtag_A from the memory A and decides whether or not a tag part TAG_ADD stored in a valid register in the management table 222 and the tag part of the address Rad_A coincide with each other (S308). If a tag part TAG_ADD stored in the management table 222 and the tag part of the address Rad_A coincide with each other (YES at S308), then it is confirmed whether the information V[1:0] is "10," for example, whether or not a failure in writing has occurred with the region for writing (S309). If a failure in writing has occurred with the region for writing, the data to be written may be allocated to a different memory region in a free state.

If a tag part TAG_ADD coincident with the tag part of the address Rad_A is not found in the management table 222 (No at S308) or if, although a coincident tag part is found, the information V[1:0] is not "10" (No at S309), the control unit 202 of the memory B decides whether or not the memory unit 201 has a free memory region (S310). If a result of the decision indicates that the memory unit 201 has a free memory region (YES at S310), the control unit 202 of the memory B stores the address value indicative of the memory region into the address Wad_B of the writing buffer 224 (S311).

Then, the control unit 202 of the memory B stores the data Rdt_A and the value of the tag Rtag_A from the memory A into the data Wdt_B and the tag Wtag_B of the writing buffer 224, respectively, and sets the write flag Wflg_B to "1" (S312). Also at a data rewriting timing into the memory B, a refresh cycle of the DRAM may be utilized. If the present point of time is not an execution timing for refreshing (refresh-busy) (NO at S313), the control unit 202 of the memory B increments the count value of the refresh counter 230 by 1 (S314). If the count value of the refresh counter 230 reaches the given value and an execution timing for refreshing comes (YES at S313), the control unit 202 of the memory B conforms the state of the write flag Wflg_B of the writing buffer 224.

If the write flag Wflg_B is "1", the control unit 202 of the memory B writes the data stored in the data Wdt_B into the memory region indicated by the address value stored in the address Wad_B of the writing buffer 224 (S315). If the write flag Wflg_B is "0", the control unit 202 of the memory B performs refreshing operation.

After the rewrite data is written into the memory region, the control unit 202 of the memory B registers the value stored in the tag Wtag_B of the writing buffer 224 into the tag part of the register corresponding to the memory region for which writing has been performed and updates the management table 222 (S316). In the updating of the management table 222 by the operation at S316, the count value HOT[15:0] is maintained without being changed. However, the count value HOT[15:0] may be controlled otherwise so as to be decremented by 1. After the operation described above comes to an end, the control unit 202 of the memory B resets both of the write flag Wflg_B of the writing buffer 224 and the readout flag Rflg_B of the reading out buffer 225 to "0", thereby ending the rewriting operation.

Figure 8:
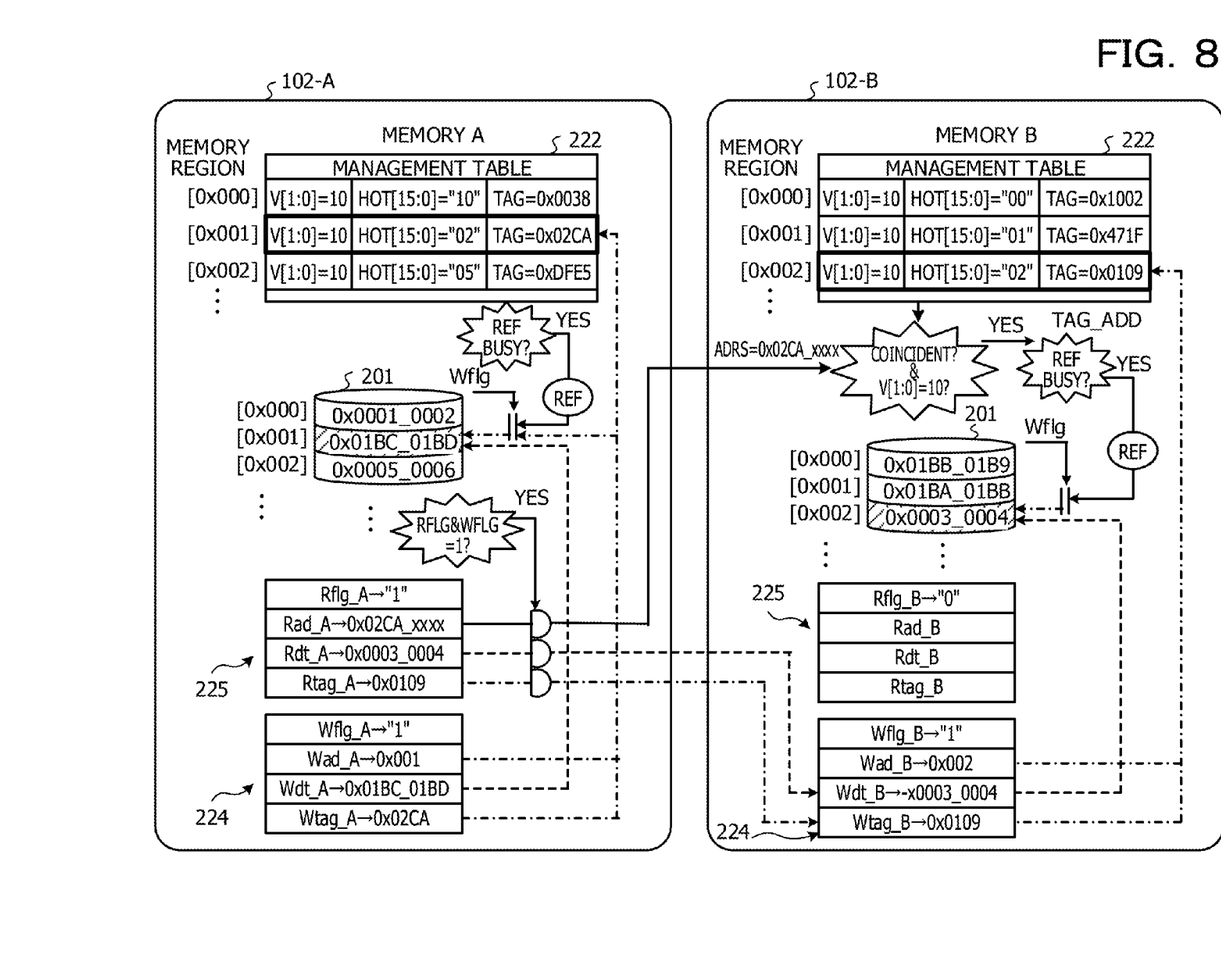
FIG. 8 depicts an example of rewriting operation.

FIG. 8 depicts an example of rewriting operation. For example, if both of the write flag Wflg_A of the writing buffer 224 and the readout flag Rflg_A of the reading out buffer 225 of the memory A become "1" as depicted in FIG. 8, the values stored in the address Rad_A, the data Rdt_A and the tag Rtag_A of the reading out buffer 225 are transferred to the memory B. Since the management table 222 of the memory B includes a tag part coincident with the tag Rtag_A transferred from the memory A and besides the information V[1:0] is "10", the values of the data Rdt_A and the tag Rtag_A transferred from the memory A are stored into the data Wdt_B and the tag Wtag_B of the writing buffer 224 of the memory B, respectively.

In the memory A, if the write flag Wflg_A of the writing buffer 224 is "1" at a timing at which refreshing is executed, the data of the data Wdt_A is written into the memory region indicated by the address Wad_A of the writing buffer 224 and the tag of the tag Wtag_A is written into the corresponding register of the management table 222. Similarly, in the memory B, if the write flag Wflg_B of the writing buffer 224 is "1" at a timing at which refreshing is executed, the data of the data Wdt_B is written into the memory region indicated by the address Wad_B of the writing buffer 224 and the tag of the tag Wtag_B is written into the corresponding register of the management table 222.

In the system in which a plurality of memory devices are coupled by cascade coupling, data which is stored in a certain memory device, for example, in the memory A, and is small in number of reading out operations and data which is stored in a next memory device, for example, in the memory B, and is great in number of reading out operations are exchanged by control between the memory devices. Therefore, data that is read out by a great number of times in the system is allocated to a memory device near to the host 101, for example, to a memory device having low memory access latency, and the allocation of data is optimized to allocation suitable for the number of times of reading out of the data (frequency of use of the data). Consequently, the latency in memory access may be improved. Since rewriting of data in memory devices for optimizing the allocation is performed at a timing at which refreshing is executed, this may not have an influence on ordinary accessing and the system performance may not be damaged.

All examples and conditional language recited herein are intended for pedagogical purposes to and the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A memory apparatus, comprising:
   a memory storing data and provided in the memory apparatus corresponding to one of a plurality of memory apparatuses, the plurality of memory apparatuses and a processor being cascade-coupled in such a manner that the processor is located at an end;
   a table configured to store a combination of a memory address and a number of reading times of the data stored in the memory;
   a writing buffer configured to store data input from another memory apparatus, which is included in the plurality of memory apparatuses and is other than the memory apparatus, and a memory address of the data from the another memory apparatus;
   a reading out buffer configured to store data to be output to the another memory apparatus and a memory address of the data to be output to the another memory apparatus;
   a refresh counter configured to count a count number and issue a request of refreshing the memory when the count number reaches a specific value; and
   a controller configured to control the memory, the controller:
      reads, from the table, minimum number of reading times as a second number of reading times;
      when first data and a first number of reading times of the first data which are output from a next memory apparatus, which is included in the plurality of memory apparatuses and is provided at a next stage of the memory apparatus as the another memory, are received in the memory apparatus and the second number of reading times is smaller than the first number of reading times, stores the first data and a first memory address of the first data in the writing buffer and outputs second data and a second address corresponding to the second number of reading times to the next memory apparatus via the reading out buffer; and
      rewrites, when the count number of the refresh counter reaches the specific value and the memory apparatus starts refreshing the memory, the second data and the second memory address in the table with the first data and the first memory address stored in the writing buffer to assign the first data to the memory of the memory apparatus having a higher memory access latency than the next memory apparatus.

2. The memory apparatus according to claim 1, wherein refreshing of the memory is performed when the count number of the refresh counter reaches the specific value.

3. The memory apparatus according to claim 1, wherein the controller outputs, in order for the next memory apparatus to rewrite the first data and the first memory address read with the second data and the second memory address, the second data and the second memory address to the next memory apparatus via the reading out buffer.

4. The memory apparatus according to claim 1, wherein the controller outputs, when data is read out from the memory, the read out data, the memory address of the read out data and the number of reading times of the read out data as the second data, the second memory address and the second number of reading times, respectively, to the next memory apparatus.

5. The memory apparatus according to claim 1, wherein the table retains, for each of memory regions included in the memory, information representative of a state of the respective memory regions indicating whether data stored in the respective memory regions is valid or invalid, and the controller refers, when data is written into one of the memory regions, to the table and determines, if there is no memory region whose memory address coincides with the memory address of the data to be written, writing of the data to be written into a memory region which indicates a free state indicating the memory region is a free region based on states of the memory regions.

6. The memory apparatus according to claim 1, wherein the controller decides whether data read out from the memory includes an error and performs, when the read out data includes an error, rewriting with corrected data.

7. The memory apparatus according to claim 6, wherein the controller allocates, when rewriting into one of memory regions included in the memory in which the data decided to include the error is stored is performed, the data for rewriting to the memory region in a free state indicating the memory region is a free region.

8. A memory system, comprising:
a plurality of memory devices including at least a first memory device and a second memory device; and
a host coupled to the first memory device and configured to perform memory access to the plurality of memory devices, the first memory device and the second memory device being cascade-coupled in such a manner that the host is located at an end and the first memory device is located between the host and the second memory device, the first memory device includes:
a memory storing data;
a table configured to store a combination of a memory address and a number of reading times of data stored in the memory;
a writing buffer configured to store data input from the second memory device and a memory address of the data input from the second memory device;
a reading out buffer configured to store data to be output to the second memory device and a memory address of the second data to be output to the second memory device;
a refresh counter configured to count a count number and issue a request of refreshing the memory when the count number reaches a specific value; and
a controller configured to control the region, and the controller:
reads, from the table, a minimum number of reading times as a second number of reading times;
when first data and a first number of reading times of the first data, which are output from the second memory device which is provided at a next stage of the first memory apparatus, are received in the first memory device and the second number of reading times is smaller than the first number of reading times, stores the first data and a first memory address of the first data in the writing buffer and outputs second data and a second address-corresponding to the second number of reading times to the second memory apparatus via the reading out buffer; and
rewrites, when the count number of the refresh counter reaches the specific value and the memory apparatus starts refreshing the memory, the second data and the second memory address in the table with the first data and the first memory address stored in the writing buffer to assign the first data to the memory of the memory apparatus having a higher memory access latency than the next memory apparatus.

9. The memory apparatus according to claim 8, wherein refreshing of the memory is performed when the count number of the refresh counter reaches the specific value.

10. The memory system according to claim 8, wherein the table retains, for each of memory regions included in the memory, information representative of a state of the respective memory regions indicating whether data stored in the respective memory regions is valid or invalid, and the controller refers, when data is written into one of the memory regions, to the table and determines, if there is no memory region whose memory address coincides with the memory address of the data to be written, writing of the data to be written into a memory region which indicates a free state indicating the memory region is a free region based on the states of the memory regions.

11. The memory system according to claim 8, wherein the controller decides whether data read out from the region includes an error and performs, when the read out data includes an error, rewriting with corrected data.

12. The memory according to claim 11, wherein the controller allocates, when rewriting into one of memory regions included in the memory in which the data including the error is stored is performed, the data for rewriting to the memory region in a free state indicating the memory region is a free region.

13. A memory controlling method, comprising:
receiving, in a memory apparatus corresponding to one of a plurality of memory apparatuses where the plurality of memory apparatuses and a host are cascade-coupled in such a manner that the host is located at an end and first data output from a next memory apparatus which is included in the plurality of memory apparatuses and is provided at a next stage of the memory apparatus;
reading, from a table configured to store a combination of a memory address and a number of reading times of the data stored in a memory in the memory apparatus, a minimum number of reading times as a second number of reading times;
receiving first data and a first number of reading times of the first data from the next memory apparatus;
storing, when the first number of reading times is smaller than the second number of reading times, the first data and a first memory address of the first data in a writing buffer and outputting second data and a second address corresponding to the second number of reading times to the next memory apparatus via a reading out buffer; and
rewriting, when a count number of a refresh counter, which is provided in the memory apparatus and is configured to count the count number and issue a request of refreshing the memory when the count number reaches a specific value, reaches the specific value and the memory apparatus starts refreshing the memory, the second data and the second memory address in the table with the first data and the first memory address stored in a writing buffer to assign the first data to the memory of the memory apparatus having a higher memory access latency than the next memory apparatus.

14. The memory controlling method according to claim 13, wherein refreshing of the memory is performed when the count number of the refresh counter reaches the specific value.

* * * * *